US012665005B2

(12) United States Patent
Choi et al.

(10) Patent No.: US 12,665,005 B2
(45) Date of Patent: Jun. 23, 2026

(54) STORAGE DEVICE PERFORMING DUMMY READ OPERATION, AND METHOD OF OPERATING THE SAME

(71) Applicant: Samsung Electronics Co., Ltd., Suwon-si (KR)

(72) Inventors: Yun-Ki Choi, Suwon-si (KR); Jungsoo Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 99 days.

(21) Appl. No.: 18/669,694

(22) Filed: May 21, 2024

(65) Prior Publication Data

US 2025/0157510 A1    May 15, 2025

(30) Foreign Application Priority Data

Nov. 13, 2023    (KR) ........................ 10-2023-0156003

(51) Int. Cl.
G11C 7/14        (2006.01)
G11C 7/04        (2006.01)
G11C 7/10        (2006.01)

(52) U.S. Cl.
CPC .................. G11C 7/14 (2013.01); G11C 7/04 (2013.01); G11C 7/106 (2013.01); G11C 7/1069 (2013.01)

(58) Field of Classification Search
CPC .. G11C 7/14; G11C 7/04; G11C 7/106; G11C 7/1069
See application file for complete search history.

(56) References Cited

U.S. PATENT DOCUMENTS

| | | | |
|---|---|---|---|
| 7,881,139 B2 | 2/2011 | Kim et al. | |
| 8,341,335 B2 | 12/2012 | Weingarten et al. | |
| 8,693,246 B2 | 4/2014 | Roohparvar et al. | |
| 9,658,800 B2 | 5/2017 | Darragh et al. | |
| 10,599,362 B2 | 3/2020 | Prabhu et al. | |
| 2016/0104539 A1* | 4/2016 | Kim ...................... | G11C 16/28 |
| | | | 365/185.11 |
| 2018/0129431 A1* | 5/2018 | Yang ................... | G06F 11/3034 |
| 2020/0097217 A1* | 3/2020 | Yeh ......................... | G11C 16/10 |
| 2023/0071724 A1 | 3/2023 | Chien et al. | |
| 2024/0419353 A1* | 12/2024 | Basso ...................... | G11C 7/04 |

* cited by examiner

*Primary Examiner* — Han Yang
(74) *Attorney, Agent, or Firm* — Harness, Dickey & Pierce, P.L.C.

(57)        ABSTRACT

An operating method of a storage device includes a storage controller and a non-volatile memory device. The method includes providing, by the storage controller, the non-volatile memory device with a first command indicating a temperature read operation, providing, by a temperature sensor of the non-volatile memory device, a first measurement temperature value to the storage controller based on the first command, determining, by the storage controller, whether the first measurement temperature value is lower than a first threshold value, providing, by the storage controller, the non-volatile memory device with a second command indicating a dummy read operation in response to determining that the first measurement temperature value is smaller than the first threshold value, and performing, by the non-volatile memory device, the dummy read operation for heating based on the second command.

19 Claims, 12 Drawing Sheets

Figure 2:
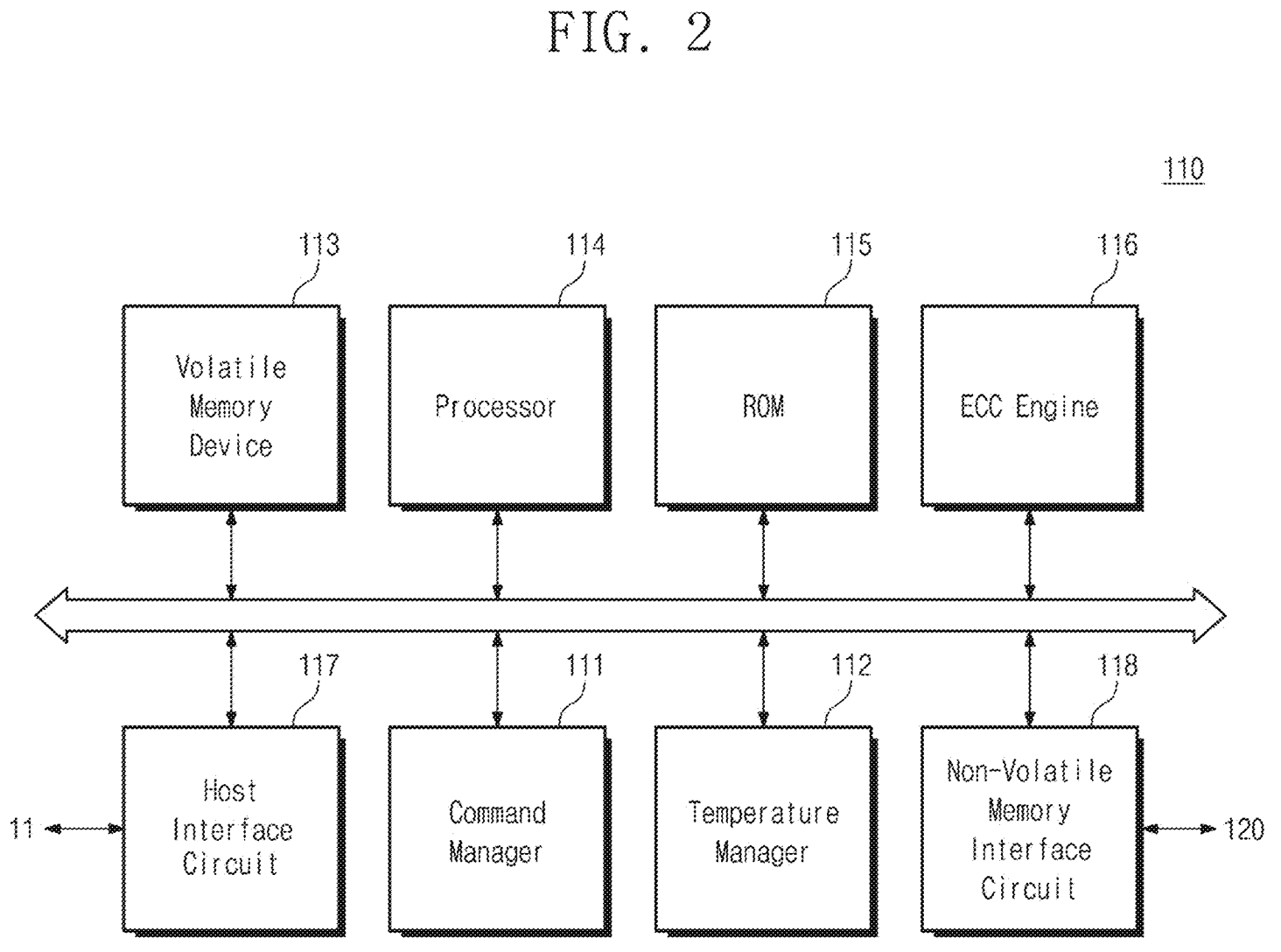

116 ECC Engine

115 ROM

114 Processor

113 Volatile Memory Device

118 Non-Volatile Memory Interface Circuit

120

112 Temperature Manager

111 Command Manager

117 Host Interface Circuit

11

Threshold Voltage Distribution for SLC

1

STORAGE DEVICE PERFORMING DUMMY READ OPERATION, AND METHOD OF OPERATING THE SAME

CROSS-REFERENCE TO RELATED APPLICATIONS

This application claims priority under 35 U.S.C. § 119 to Korean Patent Application No. 10-2023-0156003 filed on Nov. 13, 2023, in the Korean Intellectual Property Office, the disclosures of which are incorporated by reference herein in their entireties.

BACKGROUND

Example embodiments of the present disclosure described herein relate to a storage device, and more particularly, relate to a storage device performing a dummy read operation for heating and an operating method thereof.

A memory device stores data in response to a write request and outputs data stored therein in response to a read request. For example, the memory device is classified as a volatile memory device, which loses data stored therein when a power is turned off, such as a dynamic random access memory (DRAM) device or a static RAM (SRAM) device, or a non-volatile memory device, which retains data stored therein even when a power is turned off, such as a flash memory device, a phase-change RAM (PRAM), a magnetic RAM (MRAM), or a resistive RAM (RRAM).

As memory cell of the non-volatile memory device are programmed based on data bit values, the memory cells may form a threshold voltage distribution corresponding to the data bit values. The threshold voltage distribution may change depending on a temperature of the non-volatile memory device. This may mean that an error occurs for data which the non-volatile memory device reads or stores at a low temperature. Accordingly, when the temperature of the non-volatile memory device is a low temperature, the non-volatile memory device may require an operation for heating.

SUMMARY

Example embodiments of the present disclosure provide a storage device performing a dummy read operation and an operating method thereof.

According to an example embodiment, an operating method of a storage device which includes a storage controller and a non-volatile memory device includes providing, by the storage controller, the non-volatile memory device with a first command indicating a temperature read operation, providing, by a temperature sensor of the non-volatile memory device, a first measurement temperature value to the storage controller based on the first command, determining, by the storage controller, whether the first measurement temperature value is lower than a first threshold value, providing, by the storage controller, the non-volatile memory device with a second command indicating a dummy read operation in response to determining that the first measurement temperature value is smaller than the first threshold value, and performing, by the non-volatile memory device, the dummy read operation for heating based on the second command.

According to an example embodiment, a storage device includes a non-volatile memory device that includes a temperature sensor, and a storage controller that provides a temperature read command to the non-volatile memory device, receives a measurement temperature value measured by the temperature sensor, and compares the measurement temperature value with a first threshold value or a second threshold value. The first threshold value is lower than the second threshold value, the storage controller executes an activate mode when the measurement temperature value is lower than the first threshold value, and executes a passive mode when the measurement temperature value is greater than or equal to the first threshold value and is lower than the second threshold value, and the activate mode defines a dummy read operation for heating.

According to an example embodiment, an operating method of a storage controller which communicates with a non-volatile memory device includes providing the non-volatile memory device with a first command indicating a temperature read operation, receiving a first measurement temperature value from the non-volatile memory device, determining whether the first measurement temperature value is lower than a first threshold value, providing the non-volatile memory device with a second command indicating a dummy read operation in response to determining that the first measurement temperature value is lower than the first threshold value, and receiving a first response indicating that the dummy read operation is completed, from the non-volatile memory device.

BRIEF DESCRIPTION OF THE FIGURES

The above and other objects and features of the present disclosure will become apparent by describing in detail example embodiments thereof with reference to the accompanying drawings.

FIG. 1 is a block diagram of a storage system according to an example embodiment of the present disclosure.

FIG. 2 is a block diagram illustrating a storage controller of FIG. 1 in detail, according to some example embodiments of the present disclosure.

DETAILED DESCRIPTION

Figure 3:
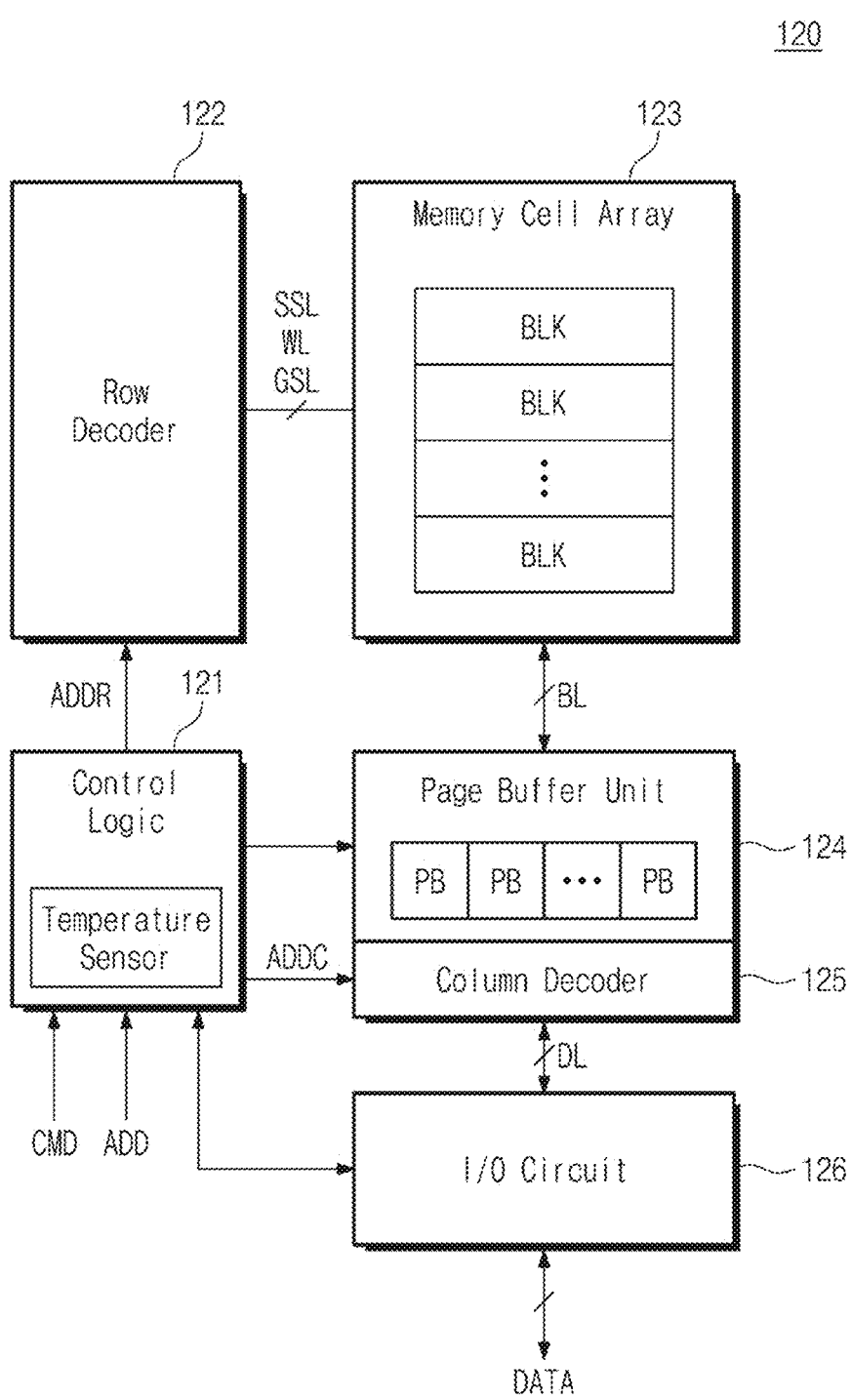
FIG. 3 is a block diagram illustrating a non-volatile memory device of FIG. 1 in detail, according to some example embodiments of the present disclosure.

Below, example embodiments of the present disclosure will be described in detail and clearly to such an extent that one skilled in the art carries out example embodiments of the present disclosure easily.

Figure 1:
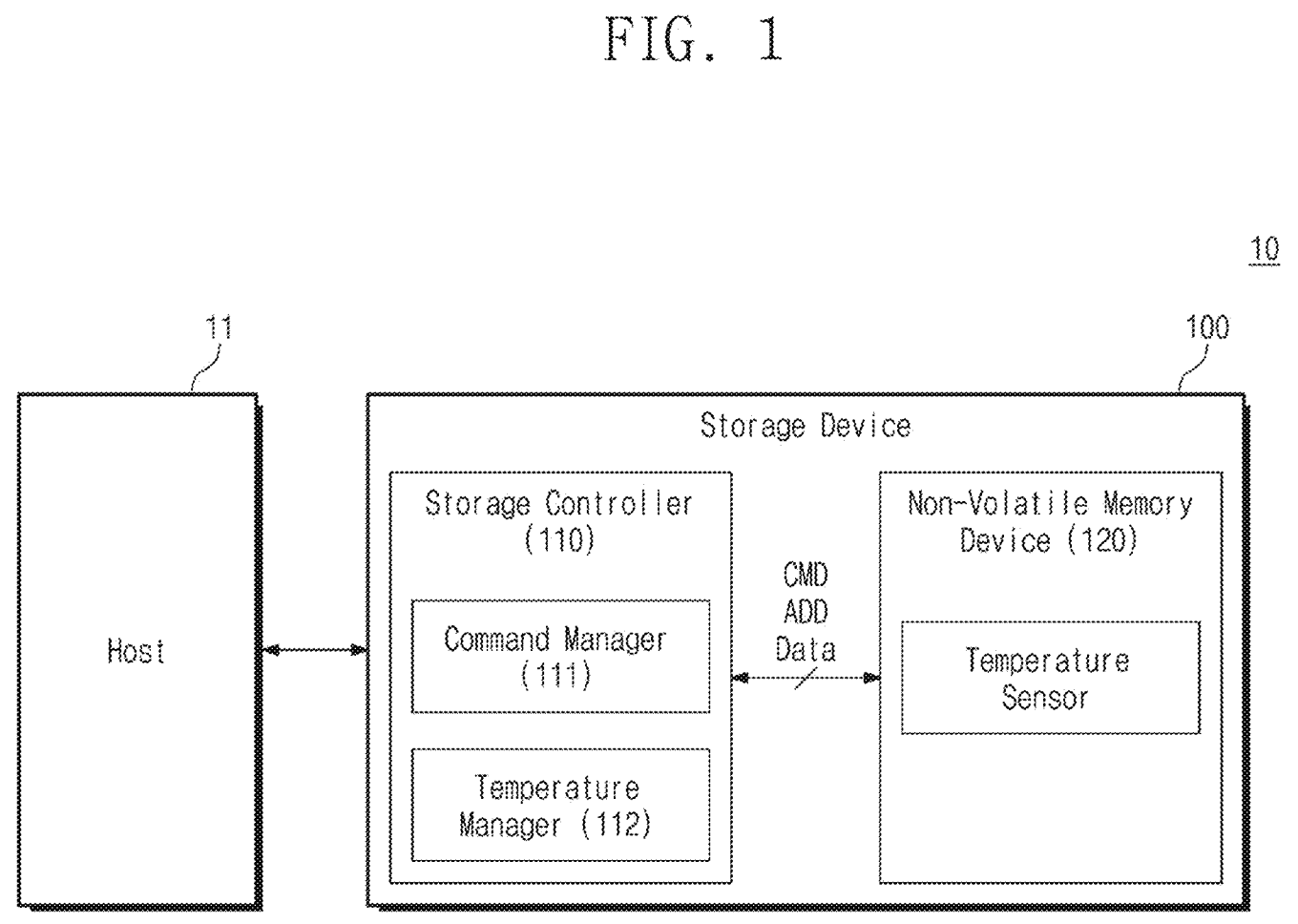

FIG. 1 is a block diagram of a storage system according to an example embodiment of the present disclosure. Referring to FIG. 1, a storage system 10 may include a host 11 and a storage device 100. In some example embodiments, the storage system 10 may refer to a computing system, which is configured to process a variety of information, such as a personal computer (PC), a notebook, a laptop, a server, a workstation, a tablet PC, a smartphone, a digital camera, and a black box.

The host 11 may control an overall operation of the storage system 10. For example, the host 11 may store data in the storage device 100 or may read data stored in the storage device 100.

The storage device 100 may include a storage controller 110 and a non-volatile memory device 120. The non-volatile memory device 120 may store data. The storage controller 110 may store data in the non-volatile memory device 120 or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

The non-volatile memory device 120 may include a temperature sensor. The temperature sensor may measure a temperature of the non-volatile memory device 120 and may generate a measurement temperature value. For example, the temperature sensor may measure the temperature of the non-volatile memory device 120 based on a command of the storage controller 110. However, the present disclosure is not limited thereto. For example, the temperature sensor may periodically measure the temperature of the non-volatile memory device 120 and may provide the measurement temperature value to the storage controller 110.

An example in which the temperature sensor is included in the non-volatile memory device 120 is illustrated in FIG. 1, but the present disclosure is not limited thereto. For example, the temperature sensor may be placed inside the storage controller 110 or the storage system 10.

An example in which the temperature sensor is included in the non-volatile memory device 120 is illustrated in the following drawings, but the present disclosure is not limited thereto as described above.

In some example embodiments, the non-volatile memory device 120 may be a NAND flash memory device, but the present disclosure is not limited thereto. For example, the non-volatile memory device 120 may be one of various storage devices, which retain data stored therein even when a power is turned off, such as a phase-change random access memory (PRAM), a magnetic random access memory (MRAM), a resistive random access memory (RRAM), and a ferroelectric random access memory (FRAM).

The storage controller 110 may include a command manager 111 and a temperature manager 112.

The command manager 111 may manage various commands indicating memory operations to be performed in the non-volatile memory device 120. For example, the command manager 111 may provide the non-volatile memory device 120 with various commands such as a read command, a write command, and an erase command.

The command manager 111 may manage a command for a dummy read operation of the non-volatile memory device 120. The non-volatile memory device 120 may perform the dummy read operation, based on the command managed by the command manager 111. The non-volatile memory device 120 may read data of a specific memory region based on the command but may not output the read data to the storage controller 110. The dummy read operation will be described in detail with reference to FIG. 5.

Also, the command manager 111 may manage a command for a rewrite operation. Through the rewrite operation, the non-volatile memory device 120 may read data stored at a low temperature after a current temperature reaches a normal temperature and may again store the read data. For example, at a low temperature, data may be stored together with a temperature value of the low temperature; after a current temperature reaches the normal temperature, the non-volatile memory device 120 may read the stored data based on the temperature value of the low temperature and may again store the read data in any other memory block. The normal temperature, which is not a low temperature or a high temperature, may be a temperature at which the non-volatile memory device 120 operates while maintaining reliability of a given level. The normal temperature of the non-volatile memory device 120 may be determined in advance depending on a design and a structure of a storage device. This will be described in detail with reference to FIG. 11.

The temperature manager 112 may compare the measurement temperature value with pre-determined threshold values to determine whether the non-volatile memory device 120 is at the low temperature. For example, each of the threshold values of the non-volatile memory device 120 may be determined in advance depending on a design and a structure of a storage device. The temperature manager 112 may perform the operation for heating of the non-volatile memory device 120 in response to determining that the non-volatile memory device 120 is at the low temperature.

The operation for heating may indicate preventive operations or recovery operations for suppressing an error due to the decrease in the temperature of the non-volatile memory device 120. When the non-volatile memory device 120 performs the read operation or the write operation at the low temperature, an error may occur. For example, the read data may be different from the stored data, or data which are different from data intended to be written in the non-volatile memory device 120 may be stored. This will be described in detail with reference to FIG. 4.

When the measurement temperature value is lower than a threshold value, the temperature manager 112 may allow the non-volatile memory device 120 to perform at least one operation such that the temperature of the non-volatile memory device 120 increases. Also, the temperature manager 112 may determine a kind of an operation to be performed by the non-volatile memory device 120 and the number of times of the operation, based on the measurement temperature value.

When the measurement temperature value is lower than a first threshold value, the temperature manager 112 may define the dummy read operation to be performed by the non-volatile memory device 120. The temperature manager 112 may request the command manager 111 to generate a command for the dummy read operation.

For example, the temperature manager 112 may define memory blocks where the dummy read operation is to be performed. The temperature manager 112 may define the number of times of the dummy read operation.

The storage controller 110 may allow the non-volatile memory device 120 to perform the dummy read operation without a host request. In this case, data of the dummy read operation may not be output from the non-volatile memory device 120. In other words, the storage device 100 may increase the temperature of the non-volatile memory device 120 quickly, based on an activate mode.

In some example embodiments, when the measurement temperature value is lower than a second threshold value greater than the first threshold value, the temperature manager 112 may define the memory operation to be performed by the non-volatile memory device 120. The memory operation may indicate a user data-related operation corresponding to a request of a host. For example, the memory operation may indicate the read operation or the write operation on user data.

In some example embodiments, the temperature manager 112 may include a mode register. The mode register may determine an operation mode of the temperature manager 112, based on a result of comparing the measurement temperature value with the first threshold value or the second threshold value.

For example, when the measurement temperature value is lower than the first threshold value, the mode register may select the activate mode. The mode register may define the dummy read operation, based on the selection of the activate mode. The mode register may determine memory cells where the dummy read operation is to be performed.

The activate mode will be described in detail with reference to FIG. 5.

As another example, when the measurement temperature value is greater than or equal to the first threshold value and is lower than the second threshold value, the mode register may select a passive mode. Based on the selection of the passive mode, the mode register may receive a request of a host and may request the command manager 111 to generate a command for the memory operation corresponding to the host request.

The storage controller 110 may allow the non-volatile memory device 120 to perform the memory operation corresponding to the host request. In other words, based on the passive mode, the storage device 100 may increase the temperature of the non-volatile memory device 120 while performing the memory operation according to the request of the host 11.

In some example embodiments, the storage controller 110 may sequentially perform memory operations each corresponding to a host request until the temperature of the non-volatile memory device 120 becomes higher than a temperature of the second threshold value.

In some example embodiments, when the non-volatile memory device 120 performs the write operation of user data in the passive mode, the non-volatile memory device 120 may perform the rewrite operation of the user data after the temperature value of the non-volatile memory device 120 is greater than or equal to the second threshold value. Accordingly, the reliability of the non-volatile memory device 120 may be improved.

The passive mode will be described in detail with reference to FIG. 8.

As another example, the temperature manager 112 may execute a normal mode in response to determining that the measurement temperature value is not lower than the first threshold value (or the second threshold value). In the normal mode, the temperature manager 112 may not perform operations for heating of the non-volatile memory device 120.

In some example embodiments, the temperature manager 112 may include a mode register. The mode register may select one of the activate mode, the passive mode, and the normal mode, based on a result of comparing the measurement temperature value and the threshold value. For example, when the mode register selects the activate mode, the mode register may determine memory cells of the non-volatile memory device 120, which are targeted for the dummy read operation, the number of times of the dummy read operation, etc.

For better understanding of the present disclosure, the description is given as the temperature manager 112 of the storage controller 110 compares the temperature of the non-volatile memory device 120 with the threshold value and performs the operation for heating of the non-volatile memory device 120, but the present disclosure is not limited thereto. In some example embodiments, the non-volatile memory device 120 may compare the temperature and the threshold value and may perform the heating operation.

FIG. 2 is a block diagram illustrating a storage controller of FIG. 1 in detail, according to some example embodiments of the present disclosure. Referring to FIGS. 1 and 2, the storage controller 110 may communicate with the host 11 and the non-volatile memory device 120. The storage controller 110 may include the command manager 111, the temperature manager 112, a volatile memory device 113, a processor 114, a read only memory (ROM) 115, an error correcting code (ECC) engine 116, a host interface circuit 117, and a non-volatile memory interface circuit 118.

The command manager 111 may manage commands indicating operations to be performed in the non-volatile memory device 120. The temperature manager 112 may compare the measurement temperature value of the non-volatile memory device 120 with the threshold value and may perform the operation for heating of the non-volatile memory device 120 based on a comparison result.

In some example embodiments, the command manager 111 and the temperature manager 112 may be implemented with a firmware module. For example, the processor 114 may implement the command manager 111 and the temperature manager 112 by loading instructions stored in the non-volatile memory device 120 to the volatile memory device 113 and executing the loaded instructions. However, the present disclosure is not limited thereto. For example, the command manager 111 and the temperature manager 112 may be implemented with separate hardware or may be implemented with a combination of hardware and software.

The volatile memory device 113 may be used as a main memory, a buffer memory, or a cache memory of the storage controller 110. The processor 114 may control an overall operation of the storage controller 110. The ROM 115 may be used as a read only memory which stores information necessary for the operation of the storage controller 110.

The ECC engine 116 may detect and correct an error of data obtained from the non-volatile memory device 120. For example, the ECC engine 116 may have an error correction capability of a given level. The ECC engine 116 may manage data having an error level (e.g., the number of flipped bits) exceeding the error correction capability as an uncorrectable error.

The storage controller 110 may communicate with the host 11 through the host interface circuit 117. In some example embodiments, the host interface circuit 117 may be implemented based on at least one of various interfaces such as a serial ATA (SATA) interface, a peripheral component interconnect express (PCIe) interface, a serial attached SCSI (SAS), a non-volatile memory express (NVMe) interface, and a universal flash storage (UFS) interface.

The storage controller 110 may communicate with the non-volatile memory device 120 through the non-volatile memory interface circuit 118. In some example embodiments, the non-volatile memory interface circuit 118 may be implemented based on the NAND interface.

FIG. 3 is a block diagram illustrating a non-volatile memory device of FIG. 1 in detail, according to some example embodiments of the present disclosure. Referring to FIGS. 1 and 3, the non-volatile memory device 120 may communicate with the storage controller 110. For example, the non-volatile memory device 120 may receive the address ADD and the command CMD from the storage controller 110. The non-volatile memory device 120 may perform data communication with the storage controller 110.

The non-volatile memory device 120 may include control logic 121, a row decoder 122, a memory cell array 123, a page buffer unit 124, a column decoder 125, and an input/output (I/O) circuit 126.

The control logic 121 may receive the command CMD and the address ADD from the storage controller 110. The command CMD may refer to a signal indicating an operation to be performed by the non-volatile memory device 120, such as a read operation, a write operation, or an erase operation. The address ADD may include a row address ADDR and a column address ADDC. The control logic 121 may control an overall operation of the non-volatile memory device 120 based on the command CMD and the address ADD. The control logic 121 may generate the row address ADDR and the column address ADDC based on the address ADD.

The control logic 121 may include a temperature sensor. The temperature sensor may generate a measurement temperature value by measuring a temperature of the non-volatile memory device 120. For example, the temperature sensor may generate the measurement temperature value based on a temperature read command from the storage controller 110.

In some example embodiments, the control logic 121 may again generate the measurement temperature value by measuring the temperature of the non-volatile memory device 120 after an operation of the non-volatile memory device 120 is performed. In this case, the operation which the non-volatile memory device 120 performs may be an operation corresponding to a command which is based on a heating operation of the storage controller 110. The control logic 121 may compare the measurement temperature value with threshold values. When the measurement temperature value is lower than a threshold value, the control logic 121 may allow the non-volatile memory device 120 to again perform the operation. The control logic 121 may repeatedly perform the above operations until the measurement temperature value is greater than the threshold value.

The row decoder 122 may receive the row address ADDR from the control logic 121. The row decoder 122 may be connected to the memory cell array 123 through string selection lines SSL, wordlines WL, and ground selection lines GSL. The row decoder 122 may decode the row address ADDR and may control voltages to be applied to the string selection lines SSL, the wordlines WL, and the ground selection lines GSL based on a result of the decoding.

The memory cell array 123 may include a plurality of memory blocks BLK.

In some example embodiments, a memory block BLK may include a plurality of pages. For example, memory cells of cell strings connected to one word line WL may be referred to as a "physical page".

In some example embodiments, one physical page may correspond to a plurality of logical pages. For example, when a memory cell is a triple level cell (TLC) storing information corresponding to three bits, a physical page may correspond to three logical pages.

The page buffer unit 124 may include a plurality of page buffers PB. The page buffer unit 124 may be connected to the memory cell array 123 through bit lines BL. The page buffer unit 124 may read data from the memory cell array 123 in units of page, by sensing voltages of the bit lines BL. Each of the plurality of page buffers PB of the page buffer unit 124 may include a latch circuit. The latch circuit may latch data read from a memory cell. Each of the plurality of page buffers PB may output the latched data to the I/O circuit 126 under control of the control logic 121, or each of the plurality of page buffers PB may discard the latched data.

The column decoder 125 may receive the column address ADDC from the control logic 121. The column decoder 125 may decode the column address ADDC and may provide the data read by the page buffer unit 124 to the I/O circuit 126 based on a decoding result.

The column decoder 125 may receive data from the I/O circuit 126 through data lines DL. The column decoder 125 may receive the column address ADDC from the control logic 121. The column decoder 125 may decode the column address ADDC and may provide the data received from the I/O circuit 126 to the page buffer unit 124 based on a decoding result. The page buffer unit 124 may store the data provided from the I/O circuit 126 in the memory cell array 123 through the bit lines BL in units of page.

The I/O circuit 126 may be connected to the column decoder 125 through the data lines DL. The I/O circuit 126 may transfer data received from the storage controller 110 to the column decoder 125 through the data lines DL. The I/O circuit 126 may provide data received through the data lines DL to the storage controller 110.

Figure 4:
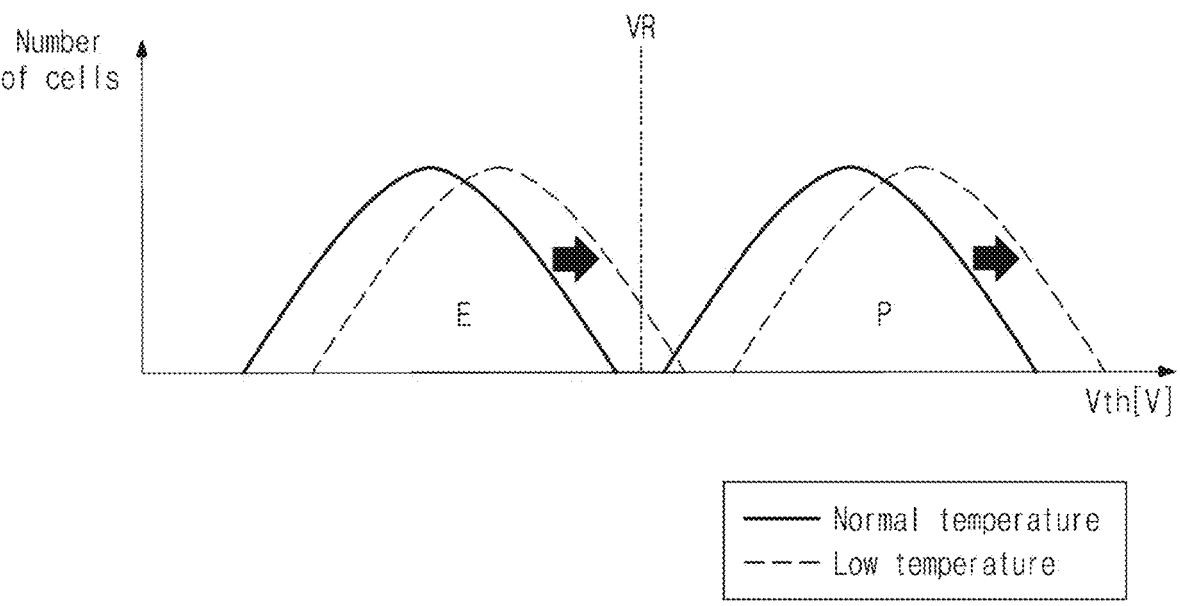
FIG. 4 is a diagram describing a change in a threshold voltage distribution according to some example embodiments of the present disclosure.

FIG. 4 is a diagram describing a change in a threshold voltage distribution according to some example embodiments of the present disclosure. How a threshold voltage distribution changes as a temperature changes will be described with reference to FIG. 4. The horizontal axis represents a threshold voltage (e.g., a level of a threshold voltage), and the vertical axis represents the number of memory cells. In the graph of FIG. 4, a solid line indicates a threshold voltage distribution at a normal temperature, and a dashed line indicates a threshold voltage distribution at a low temperature.

For convenience of description, a change in a threshold voltage distribution of a single level cell (SLC) will be described. The single level cell is intended to refer to a memory cell storing one bit. However, the present disclosure is not limited thereto. For example, the memory cell may be implemented with one of a multi-level cell storing two bits, a triple level cell storing three bits, and a quadruple level cell four bits.

The single level cell SLC may have one of an erase state "E" and a programming state "P" whose threshold voltage distributions sequentially increase.

In the single level cell SLC, a read voltage level VR may refer to a voltage for distinguishing the erase state "E" from the programming state "P". A physical page corresponding to the single level cell SLC may correspond to one logical page. In the single level cell SLC, the read operation corresponding to a logical page may be performed based on the read voltage level VR.

At the normal temperature, the erase state "E" and the programming state "P" may be distinguished by the read voltage level VR. However, a threshold voltage level may have an influence of a temperature.

A threshold voltage distribution which is formed at the low temperature may be different from a threshold voltage distribution which is formed at the normal temperature. For example, as the temperature decreases, the threshold voltage distribution may be shifted to a higher threshold voltage distribution. In this case, the read voltage level VR which is used/determined based on the normal temperature may not be a read voltage level optimized to distinguish the erase state "E" from the programming state "P". That is, an error may occur when the data are read at the low temperature. In at least one example embodiment described herein, a temperature at or below −40° C. may be considered to be a low operating temperature, and may correspond to a low temperature threshold. In other example embodiments, a temperature at or below 0° C. may be defined as a low operating temperature, and may correspond to a low temperature threshold. Other example embodiments are not limited to these examples of low operating temperatures.

Accordingly, to prevent or reduce the above error caused at the low temperature, a storage device may control a non-volatile memory device such that an operation corresponding to a host request is performed after a temperature increases to the normal temperature.

Figure 5:
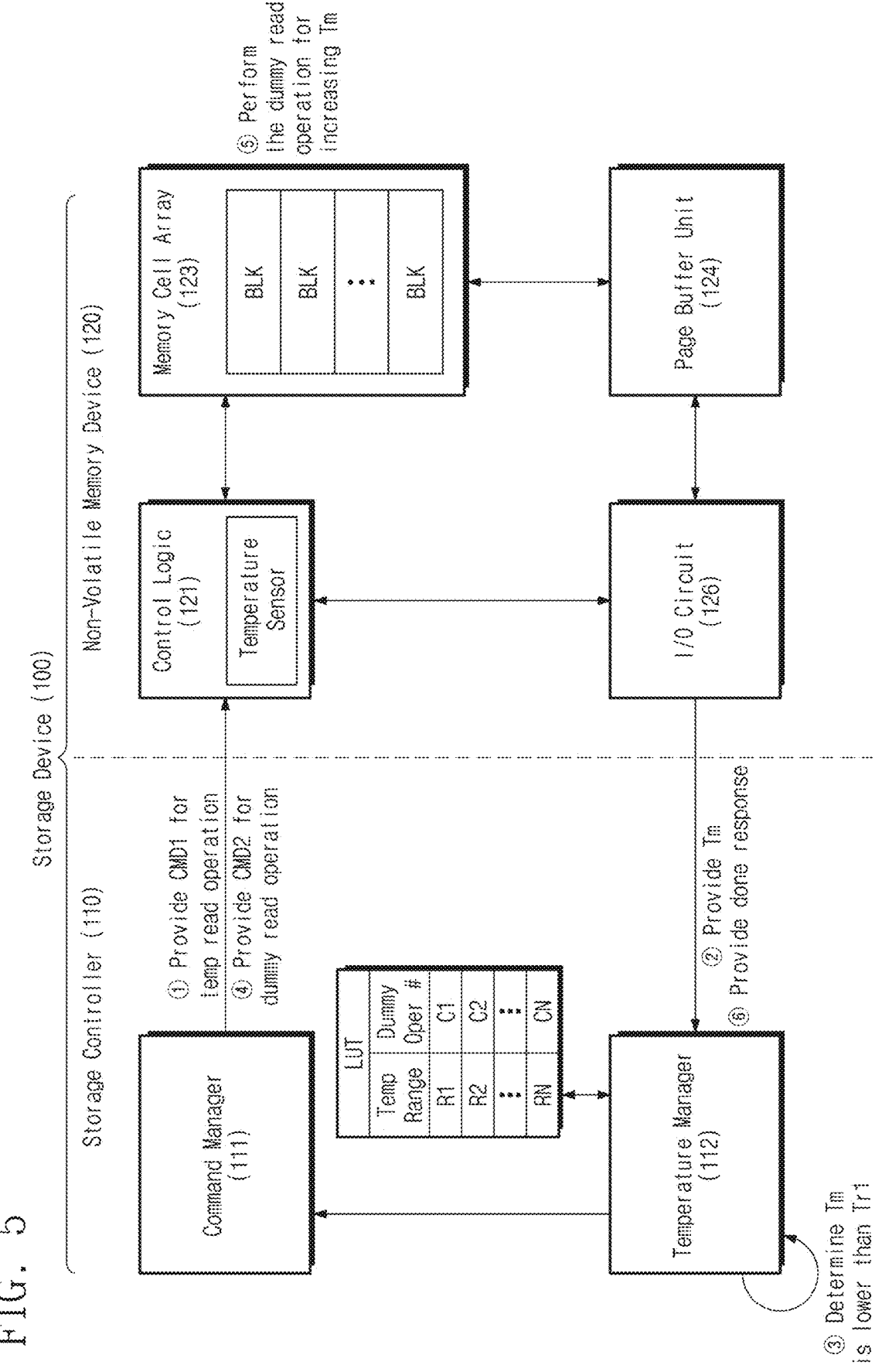
FIG. 5 is a diagram describing a method in which a storage device according to example embodiments of the present disclosure operates in an activate mode.

FIG. 5 is a diagram describing a method in which a storage device according to example embodiments of the present disclosure operates in an activate mode. Referring to FIG. 5, the storage device 100 may include the storage controller 110 and the non-volatile memory device 120. The storage controller 110 may include the command manager 111 and the temperature manager 112. The non-volatile memory device 120 may include the control logic 121, the memory cell array 123, the page buffer unit 124, and the I/O circuit 126.

The command manager 111 may generate a command indicating the temperature read operation of the non-volatile memory device 120. The temperature read operation may indicate an operation of generating and outputting the measurement temperature value of the non-volatile memory device 120. The measurement temperature value of the non-volatile memory device 120 may be obtained by the temperature read operation.

The command manager 111 may generate a command indicating the dummy read operation. According to the dummy read operation of the present disclosure, the non-volatile memory device 120 may perform the read operation but may not output data of the read operation.

In some example embodiments, the dummy read operation may indicate an operation of latching the read data in a page buffer and discarding the latched data.

The temperature manager 112 may receive a measurement temperature value Tm through the non-volatile memory device 120. The temperature manager 112 may determine whether the measurement temperature value Tm is lower than a first threshold value Tr1. Based on determining that the measurement temperature value Tm is lower than the first threshold value Tr1, the temperature manager 112 may request the command manager 111 to generate the command indicating the dummy read operation.

In some example embodiments, the temperature manager 112 may execute the activate mode in response to determining that the measurement temperature value Tm is lower than the first threshold value Tr1. To execute the activate mode may be to define the dummy read operation for heating.

In some example embodiments, based on determining that the measurement temperature value Tm is lower than the first threshold value Tr1, the temperature manager 112 may determine the number of times of the dummy read operation to be performed by the non-volatile memory device 120 with reference to a look-up-table (LUT).

For example, the storage controller 110 may further include the LUT. The LUT may include a plurality of temperature ranges R1, R2, . . . , RN and a plurality of operation counts C1, C2, . . . , CN respectively corresponding to the plurality of temperature ranges R1, R2, . . . , RN. Each of the plurality of temperature ranges R1, R2, . . . , RN may be a temperature range lower than the first threshold value Tr1, and the plurality of temperature ranges R1, R2, . . . , RN may not overlap each other. Each of the plurality of operation counts C1, C2, . . . , CN may indicate the number of times of the dummy read operation which the non-volatile memory device 120 performs.

In detail, the first operation count C1 corresponding to the first temperature range R1 among the plurality of temperature ranges R1, R2, . . . , RN may be lower than the second operation count C2 corresponding to the second temperature range R2 lower than the first temperature range R1 from among the plurality of temperature ranges R1, R2, . . . , RN.

The temperature manager 112 may determine the number of times of the dummy read operation, based on the LUT and a measurement temperature value. For example, the temperature manager 112 may refer to a target operation count corresponding to a target temperature range, in which the measurement temperature value is included, from among the plurality of temperature ranges R1, R2, . . . , RN. The temperature manager 112 may request the command manager 111 to generate a command which indicates the iteration of the dummy read operation as much as the target operation count.

The control logic 121 may communicate with the command manager 111, the memory cell array 123, and the I/O circuit 126. The control logic 121 may perform an operation corresponding to a command received from the command manager 111. For example, based on the command from the command manager 111, the temperature sensor of the control logic 121 may measure the temperature of the non-volatile memory device 120 to generate a measurement temperature value. As another example, the control logic 121 may perform the dummy read operation, based on the command from the command manager 111.

In some example embodiments, the control logic 121 may repeat the dummy read operation as much as the target operation count, based on the command from the command manager 111.

The memory cell array 123 may include the plurality of memory blocks BLK. The dummy read operation may indicate an operation of reading data of a region of the memory cell array 123, which is indicated by the command, but not outputting the data. For example, the dummy read operation may indicate an operation of latching data in the page buffer PB of the page buffer unit 124 and discarding the latched data.

The I/O circuit 126 may communicate with the control logic 121, the memory cell array 123, and the storage controller 110. Under control of the control logic 121, the I/O circuit 126 may provide the measurement temperature value to the storage controller 110.

Below, an operating method of the storage device 100 according to some example embodiments of the present disclosure will be described in detail.

In a first operation ①, the command manager 111 may provide the non-volatile memory device 120 with a first command CMD1 indicating the temperature read operation. The temperature sensor of the control logic 121 may generate the measurement temperature value Tm based on the first command CMD1. The control logic 121 may provide the measurement temperature value Tm to the I/O circuit 126.

In a second operation ②, the I/O circuit 126 may provide the measurement temperature value Tm to the storage controller 110. For example, the I/O circuit 126 may provide the storage controller 110 with a response which indicates the temperature read operation is completed and includes the measurement temperature value Tm.

In a third operation ③, the temperature manager 112 may determine whether the measurement temperature value Tm is lower than the first threshold value Tr1. The temperature manager 112 may execute the activate mode based to determining that the measurement temperature value Tm is lower than the first threshold value Tr1. The temperature manager 112 may request the command manager 111 to generate a second command CMD2 indicating the dummy read operation. The temperature manager 112 may designate a target memory block BLK, in which the dummy read operation is to be performed, from among the plurality of memory blocks BLK. The second command CMD2 may include information about the target memory block BLK.

In some example embodiments, the temperature manager 112 may refer to the LUT based on the measurement temperature value Tm and may determine the number of times of the dummy read operation to be performed by the non-volatile memory device 120. In this case, the temperature manager 112 may request the command manager 111 to generate the second command CMD2 indicating the iteration of the dummy read operation as much as the determined operation count.

In a fourth operation ④, the command manager 111 may provide the non-volatile memory device 120 with the second command CMD2 indicating the dummy read operation.

In a fifth operation ⑤, the non-volatile memory device 120 may perform the dummy read operation for increasing a measurement temperature value, based on the second command CMD2.

In some example embodiments, based on the second command CMD2, the non-volatile memory device 120 may read data of the target memory block so as to be latched in a page buffer and may discard the latched data.

Figure 6:
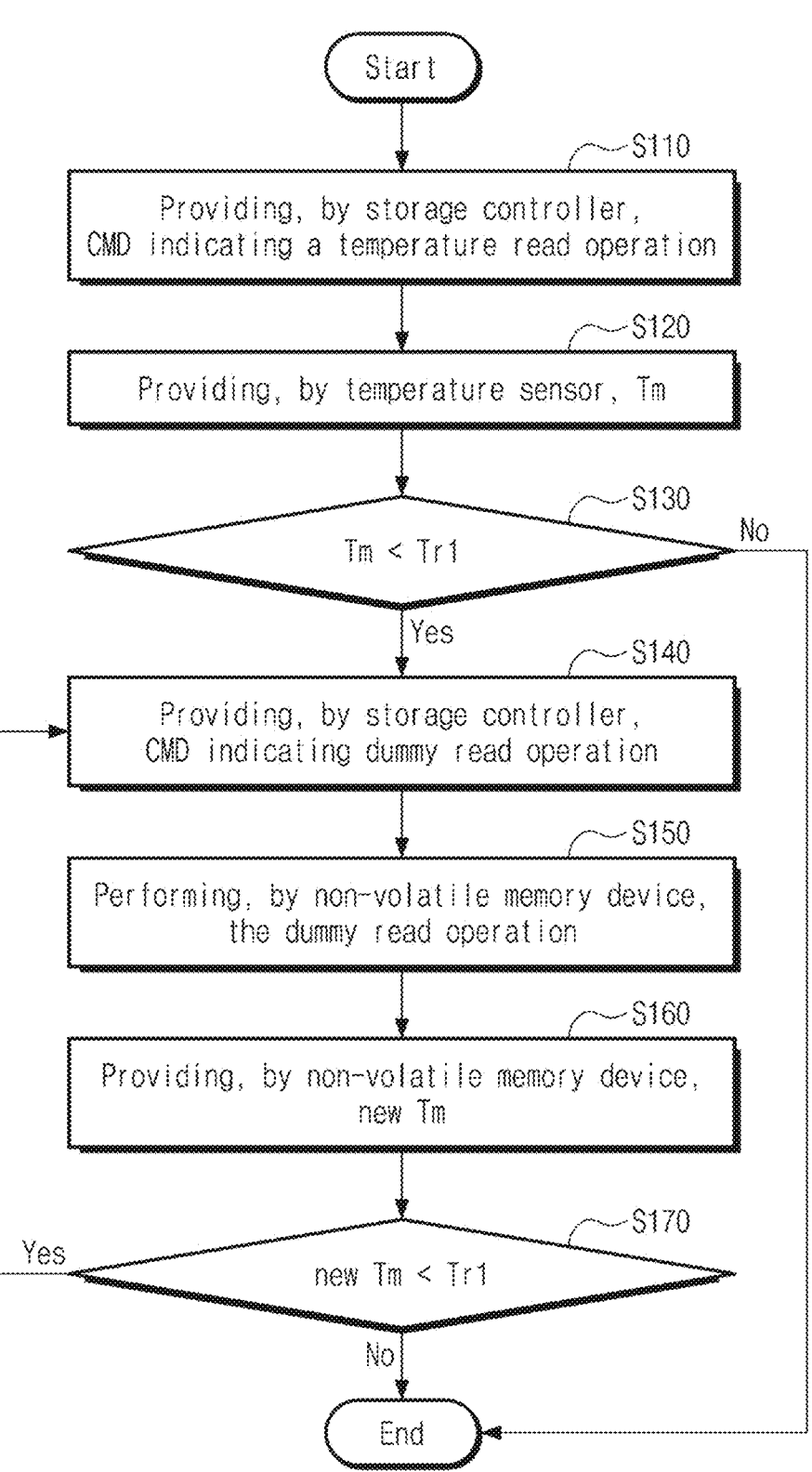
FIG. 6 is a flowchart describing a method in which a storage device according to example embodiments of the present disclosure operates in an activate mode.

FIG. 6 is a flowchart describing a method in which a storage device according to example embodiments of the present disclosure operates in an activate mode. A method in which a storage device according to some example embodiments of the present disclosure operates in the activate mode will be described with reference to FIG. 6. The storage device may include a storage controller and a non-volatile memory device. The storage device may correspond to the storage device 100 of FIG. 5.

In operation S110, the storage controller of the storage device may provide the non-volatile memory device with a command indicating the temperature read operation. In this case, the command may be referred to as a "first command".

In operation S120, a temperature sensor of the non-volatile memory device in the storage device may provide the measurement temperature value Tm to the storage controller based on the first command.

In operation S130, the storage controller of the storage device may determine whether the measurement temperature value Tm is lower than the first threshold value Tr1. When the measurement temperature value Tm is not lower than the first threshold value Tr1, the execution of the activate mode of the storage device may end. When the measurement temperature value Tm is lower than the first threshold value Tr1, the storage controller may perform operation S140.

In operation S140, the storage controller of the storage device may provide the non-volatile memory device with a command indicating the dummy read operation. In this case, the command may be referred to as a "second command". For example, the second command may indicate the dummy read operation on a target memory block.

In operation S150, the non-volatile memory device of the storage device may perform the dummy read operation based on the second command.

In some example embodiments, operation S150 may include latching, by the non-volatile memory device, data of the target memory block in a page buffer and discarding the latched data.

In operation S160, the non-volatile memory device of the storage device may provide a new measurement temperature value to the storage controller. The new measurement temperature value may indicate a measurement temperature value of the non-volatile memory device, which the temperature sensor measures after the dummy read operation is completed.

In operation S170, the storage controller of the storage device may determine whether the new measurement temperature value Tm is lower than the first threshold value Tr1. When the new measurement temperature value Tm is lower than the first threshold value Tr1, the storage device may return to operation S140. When the new measurement temperature value Tm is not lower than the first threshold value Tr1, the execution of the activate mode of the storage device may end.

For example, in operation S140, the storage device may provide the non-volatile memory device with a command indicating the dummy read operation, based on determining that the new measurement temperature value Tm is lower than the first threshold value Tr1. In this case, the command may be referred to as a "third command". In operation S150, the non-volatile memory device may again perform the dummy read operation based on the third command.

In other words, the storage controller may generate the command indicating the dummy read operation until the measurement temperature value is greater than the first threshold value Tr1, and the non-volatile memory device may repeatedly perform the dummy read operation based on the command, without the storage device using the LUT.

Figure 7:
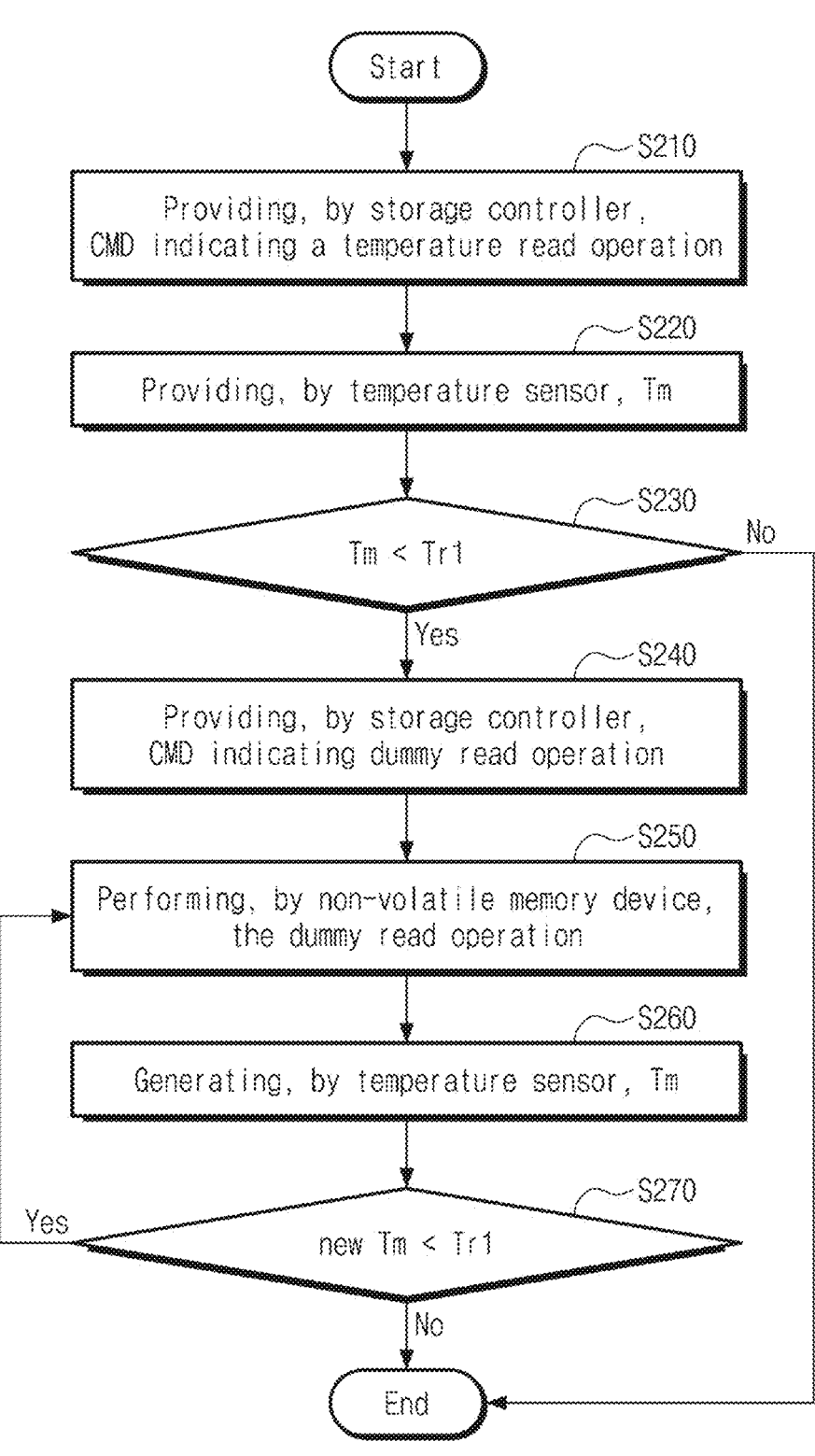
FIG. 7 is a flowchart describing a method in which a storage device according to example embodiments of the present disclosure operates in an activate mode.

FIG. 7 is a flowchart describing a method in which a storage device according to example embodiments of the present disclosure operates in an activate mode. A method in which a storage device according to some example embodiments of the present disclosure operates in the activate mode will be described with reference to FIG. 7. The storage device may include a storage controller and a non-volatile memory device. The storage device of FIG. 7 may correspond to the storage device 100 of FIG. 5.

Operation S210, operation S220, operation S230, and operation S240 are the same as operation S110, operation S120, operation S130, and operation S140 of FIG. 6, and thus, additional description will be omitted to avoid redundancy.

In operation S250, the non-volatile memory device of the storage device may perform the dummy read operation.

In some example embodiments, the non-volatile memory device may perform the read operation on the target memory block, may latch data of the read operation in the page buffer, and may discard the latched data.

In operation S260, the non-volatile memory device of the storage device may generate a new measurement temperature value Tm. The new measurement temperature value Tm may be a measurement temperature value which is generated as the temperature sensor measures a temperature after the dummy read operation is completed.

In operation S270, the non-volatile memory device of the storage device may determine whether the new measurement temperature value Tm is lower than the first threshold value Tr1. When the new measurement temperature value Tm is lower than the first threshold value Tr1, the storage device may again perform operation S250. When it is determined that the new measurement temperature value Tm is not lower than the first threshold value Tr1, the execution of the activate mode of the storage device may end.

In other words, the storage device may not refer to the LUT, and the non-volatile memory device may repeatedly perform the dummy read operation based on one command indicating the dummy read operation, until the measurement temperature value is not smaller than the first threshold value Tr1.

Figure 8:
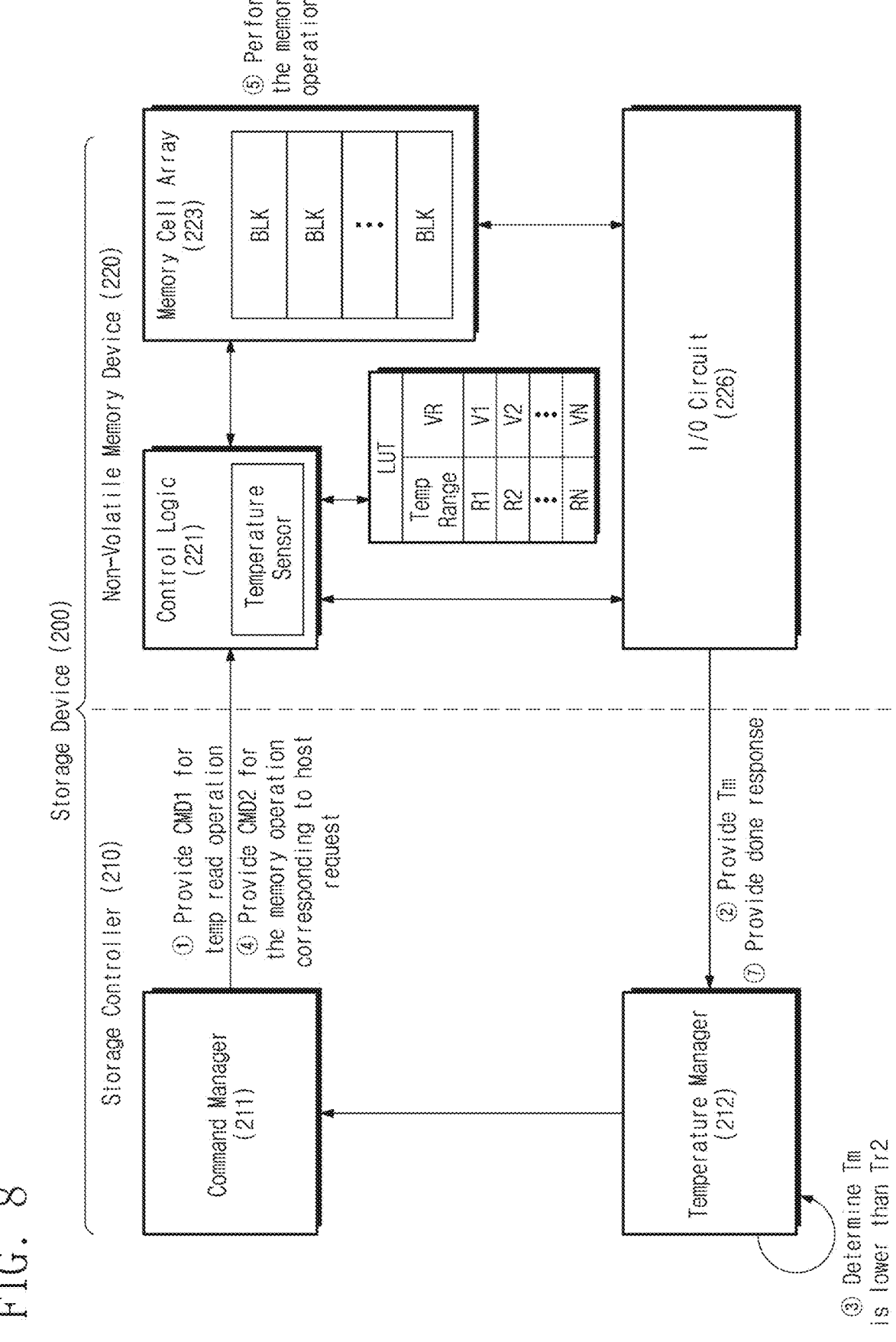
FIG. 8 is a diagram describing a method in which a storage device according to example embodiments of the present disclosure operates in a passive mode.

FIG. 8 is a diagram describing a method in which a storage device according to example embodiments of the present disclosure operates in a passive mode. A method in which a storage device according to some example embodiments operates in the passive mode will be described with reference to FIG. 8. A storage device 200 may include a storage controller 210 and a non-volatile memory device 220. The storage controller 210 may include a command manager 211 and a temperature manager 212. The non-volatile memory device 220 may include control logic 221, a memory cell array 223, and an I/O circuit 226.

The command manager 211 may manage a command indicating the temperature read operation. For example, in the temperature read operation, a temperature sensor of the non-volatile memory device 220 may generate a measurement temperature value by measuring a temperature.

Also, the command manager 211 may manage a command indicating the memory operation. For example, the command manager 211 may manage a command indicating the memory operation corresponding to a request received from the host 11. In detail, the memory operation corresponding to the request from the host 11 may include various operations on user data such as a write operation, a read operation, and an erase operation.

The temperature manager 212 may compare the measurement temperature value Tm with threshold values. For example, the temperature manager 212 may determine whether the measurement temperature value Tm is lower than a second threshold value Tr2. The temperature manager 212 may determine that the measurement temperature value Tm is lower than the second threshold value Tr2 and may execute the passive mode.

In some example embodiments, the temperature manager 212 may first compare the measurement temperature value Tm with a first threshold value before the comparison with the second threshold value Tr2. The first threshold value may be lower than the second threshold value Tr2. For example, in response to determining that the measurement temperature value Tm is not lower than the first threshold value, the temperature manager 212 may determine whether the measurement temperature value Tm is lower than the second threshold value Tr2.

Based on the execution of the passive mode, the temperature manager 212 may request the command manager 211 to generate a command indicating a memory operation corresponding to a request from a host.

The command manager 211 may provide the non-volatile memory device 220 with a second command indicating the memory operation depending on the request of the temperature manager 212.

In some example embodiments, the second command may include the measurement temperature value Tm.

The control logic 221 may communicate with the storage controller 210, the memory cell array 223, and the I/O circuit 226. The control logic 221 may perform the memory operation with respect to the memory cell array 223 based on the command received from the storage controller 210. For example, the control logic 221 may perform the read operation on a specific memory block of the memory cell array 223 based on the read command from the storage controller 210. As another example, based on a write command received from the storage controller 210 and including user data, the control logic 221 may write the user data in a target memory block of the memory cell array 223.

In some example embodiments, the control logic 221 may receive the second command for the write operation of user data, may adjust a read voltage level with reference to the LUT, and may perform the write operation of the user data. The control logic 221 may include the LUT or may communicate with a memory device of a storage device, which stores the LUT.

For example, the LUT may include the plurality of temperature ranges R1, R2, . . . , RN and a plurality of read voltage levels V1, V2, . . . , VN. The plurality of temperature ranges R1, R2, . . . , RN may not overlap each other. Each of the plurality of temperature ranges R1, R2, . . . , RN may correspond to one read voltage level. One read voltage level corresponding to each of the plurality of temperature ranges R1, R2, . . . , RN may be determined in advance from a large data set. The large data set may be data associated with a change in a temperature and a change in a threshold voltage distribution.

The control logic 221 may refer to the LUT based on the measurement temperature value Tm included in the second command. The control logic 221 may adjust a read voltage level of the write operation to a read voltage level corresponding to a temperature range in which the measurement temperature value Tm is included.

For example, when the measurement temperature value Tm is included in the first temperature range R1, the control logic 221 may adjust the read voltage level of the write operation to the first voltage level V1. The control logic 221 may store the user data in the memory cell array 223 based on the first voltage level V1.

The memory cell array 223 may include a plurality of memory blocks BLK1, BLK2, . . . , BLKM.

In some example embodiments, the plurality of memory blocks BLK1, BLK2, . . . , BLKM may have the same temperature resistance or different temperature resistances. For example, the first memory block BLK1 may have a small change in a threshold voltage distribution according to a temperature change compared to the remaining memory blocks BLK2, . . . , BLKM.

For example, based on the write command, the non-volatile memory device 120 may first store the user data in the first memory block BLK1 whose temperature resistance is great.

The I/O circuit 226 may communicate with the control logic 221 and the memory cell array 223. The I/O circuit 226 may receive a measurement temperature value from the control logic 221. The I/O circuit 226 may receive data of the read operation from the memory cell array 223. The I/O circuit 226 may provide the storage controller 210 with a response indicating that the operation corresponding to the command of the storage controller 210 is completed.

Below, an operating method of the storage device 200 according to some example embodiments of the present disclosure will be described in detail.

In a first operation ①, the command manager 211 may provide the non-volatile memory device 220 with the first command CMD1 indicating the temperature read operation.

In a second operation ②, the I/O circuit 226 may provide the measurement temperature value Tm to the storage controller 210. The I/O circuit 226 may receive a measurement temperature value which the temperature sensor of the control logic 221 measures based on the first command CMD1.

In a third operation ③, the temperature manager 212 may determine whether the measurement temperature value Tm is lower than the second threshold value Tr2. The temperature manager 212 may execute the passive mode in response to determining that the measurement temperature value Tm is lower than the second threshold value Tr2. Based on the execution of the passive mode, the temperature manager 212 may request the command manager 211 to generate a command indicating a memory operation corresponding to a request of a host.

In a fourth operation ④, the command manager 211 may provide the non-volatile memory device 220 with the second command CMD2 indicating the memory operation corresponding to the host request.

In a fifth operation ⑤, the non-volatile memory device 220 may perform the memory operation, which the second command CMD2 indicates, based on the second command CMD2. As the non-volatile memory device 220 performs the memory operation, a temperature may increase.

For example, when the memory operation indicated by the second command CMD2 is the read operation on the first memory block BLK1, the control logic 221 may perform the read operation on the first memory block BLK1 of the memory cell array 223. Data of the read operation may be output to the storage controller 210 through the I/O circuit 226.

As another example, when the memory operation indicated by the second command CMD2 is the write operation of the first memory block BLK1 associated with user data, the control logic 221 may write the user data in the first memory block BLK1 of the memory cell array 223. In this case, the second command CMD2 may include the measurement temperature value Tm, and the control logic 221 may store the measurement temperature value Tm in the first memory block BLK1 together with the user data.

In some example embodiments, the measurement temperature value Tm may be stored in the form of a tag of the user data. For example, the non-volatile memory device 220 may read the measurement temperature value Tm and a temperature tag together.

Data which are stored in the non-volatile memory device 220 while the passive mode is executed will be described in detail with reference to FIG. 11.

Figure 9:
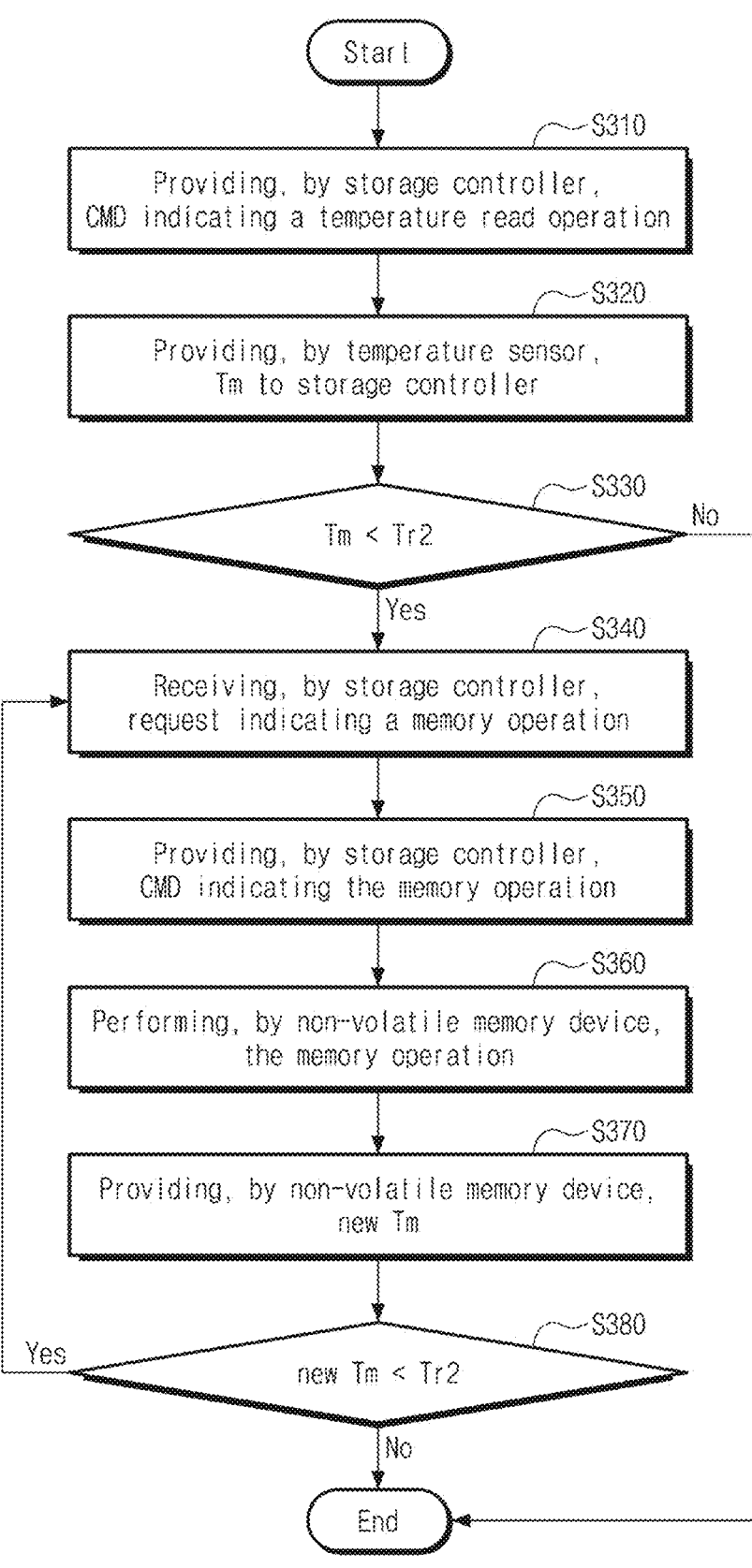
FIG. 9 is a flowchart describing a method in which a storage device according to example embodiments of the present disclosure operates in a passive mode.

FIG. 9 is a flowchart describing a method in which a storage device according to example embodiments of the present disclosure operates in a passive mode. A method in which a storage device according to some example embodiments operates in the passive mode will be described with reference to FIG. 9. The storage device may include a storage controller and a non-volatile memory device. The storage device of FIG. 9 corresponds to the storage device 200 of FIG. 8.

In operation S310, the storage controller of the storage device may provide the non-volatile memory device with a command indicating the temperature read operation.

In operation S320, the non-volatile memory device of the storage device may provide the measurement temperature value Tm to the storage controller.

In operation S330, the storage controller of the storage device may determine whether the measurement temperature value Tm is lower than the second threshold value Tr2. When it is determined that the measurement temperature value Tm is lower than the second threshold value Tr2, operation S340 may be performed. When it is determined that the measurement temperature value Tm is not lower than the second threshold value Tr2, the method may end.

In some example embodiments, first, the storage controller may determine whether the measurement temperature value Tm is lower than the first threshold value Tr1. Based on determining that the measurement temperature value Tm is lower than the first threshold value Tr1, the storage controller of the storage device may determine whether the measurement temperature value Tm is lower than the second threshold value Tr2.

In operation S340, the storage controller of the storage device may receive a request indicating a memory operation from a host. For example, the memory operation may be the erase, read, or write operation of user data. In this case, the host request may be referred to as a "first request".

In operation S350, the storage controller of the storage device may provide the non-volatile memory device with a command indicating a memory operation corresponding to the host request.

In operation S360, the non-volatile memory device of the storage device may perform the memory operation based on the command indicating the memory operation.

In operation S370, the non-volatile memory device of the storage device may provide a new measurement temperature value Tm to the storage controller. The new measurement temperature value Tm may indicate a temperature of the non-volatile memory device, which the temperature sensor measures after the memory operation is completed.

In operation S380, the storage controller of the storage device may again determine whether the new measurement temperature value Tm is lower than the second threshold value Tr2. When it is determined that the new measurement temperature value Tm is lower than the second threshold value Tr2, operation S340 may be again performed. When it is determined in operation S380 that the new measurement temperature value Tm is not lower than the second threshold value Tr2, the method may end.

For example, when operation S340 is again performed, the storage controller of the storage device may receive a request indicating a memory operation from the host. In this case, the request received from the host may be referred to as a "second request". Next, in operation S350, the storage controller of the storage device may provide the non-volatile memory device with a command indicating a memory operation corresponding to the second request. In operation S360, the non-volatile memory device of the storage device may perform the memory operation corresponding to the second request. In operation S370, the non-volatile memory device of the storage device may provide the new measurement temperature value Tm to the storage controller.

In other words, the storage device may sequentially perform memory operations respectively corresponding to requests of the host until the measurement temperature value Tm is not lower than the second threshold value Tr2.

Figure 10:
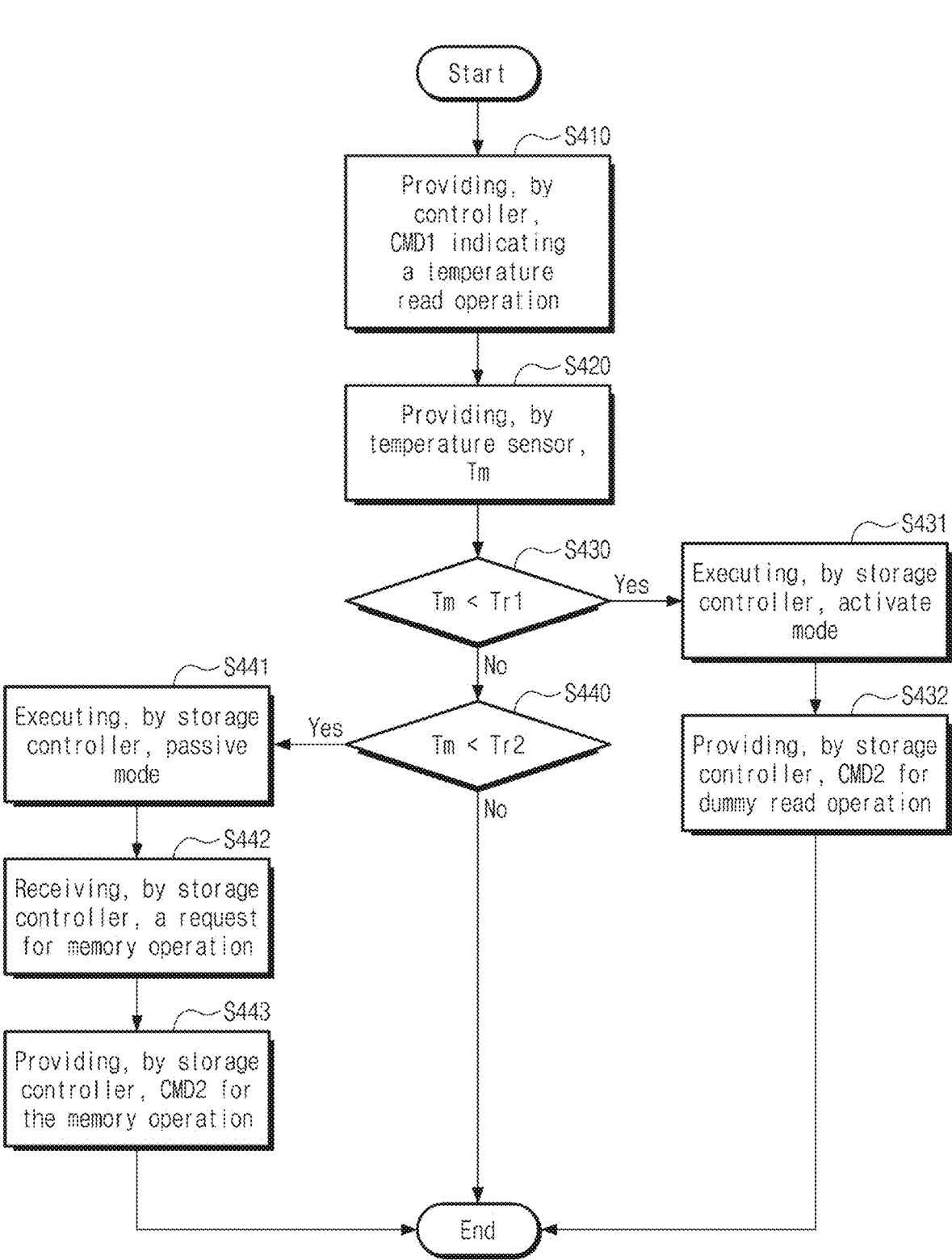
FIG. 10 is a flowchart describing an operating method of a storage device according to some example embodiments of the present disclosure.

FIG. 10 is a flowchart describing an operating method of a storage device according to some example embodiments of the present disclosure. An operating method of a storage device according to some example embodiments will be described with reference to FIG. 10. The storage device may include a storage controller and a non-volatile memory device.

In operation S410, the storage controller of the storage device may provide the non-volatile memory device with the first command CMD1 indicating the temperature read operation.

In operation S420, the non-volatile memory device of the storage device may provide the measurement temperature value Tm to the storage controller based on the first command CMD1.

In operation S430, the storage controller of the storage device may determine whether the measurement temperature value Tm is lower than the first threshold value Tr1. When it is determined that the measurement temperature value Tm is lower than the first threshold value Tr1, the storage device may perform operation S431. When it is determined that the measurement temperature value Tm is not lower than the first threshold value Tr1, the storage device may perform operation S440.

In operation S431, the storage controller of the storage device may execute the activate mode.

In operation S432, the storage controller of the storage device may provide the non-volatile memory device with a second command indicating the dummy read operation based on the execution of the activate mode.

In some example embodiments, the second command may indicate the iteration of the dummy read operation as much as a target operation count determined with reference to the LUT. The non-volatile memory device may repeatedly perform the dummy read operation as much as the target operation count based on the second command.

In operation S440, the storage controller of the storage device may determine whether the measurement temperature value Tm is lower than the second threshold value Tr2. The second threshold value Tr2 may be greater than the first threshold value Tr1. When it is determined in operation S440 that the measurement temperature value Tm is lower than the second threshold value Tr2, the storage device may perform operation S441. When it is determined that the measurement temperature value Tm is not lower than the second threshold value Tr2, the method may end.

In some example embodiments, the second threshold value Tr2 may be identical to a lower limit value of a normal operation temperature range of the non-volatile memory device.

In operation S441, the storage controller of the storage device may execute passive mode.

In operation S442, the storage controller of the storage device may receive a request indicating a memory operation from a host based on the execution of the passive mode.

In operation S443, the storage controller of the storage device may provide the non-volatile memory device with the second command CMD2 indicating the memory operation corresponding to the request. The non-volatile memory device may perform the memory operation corresponding to the host request based on the second command CMD2.

In some example embodiments, when the second command CMD2 indicates the write operation of user data and includes the measurement temperature value Tm, the non-volatile memory device of the storage device may store the user data based on a read voltage level adjusted with reference to the LUT.

Figure 11:
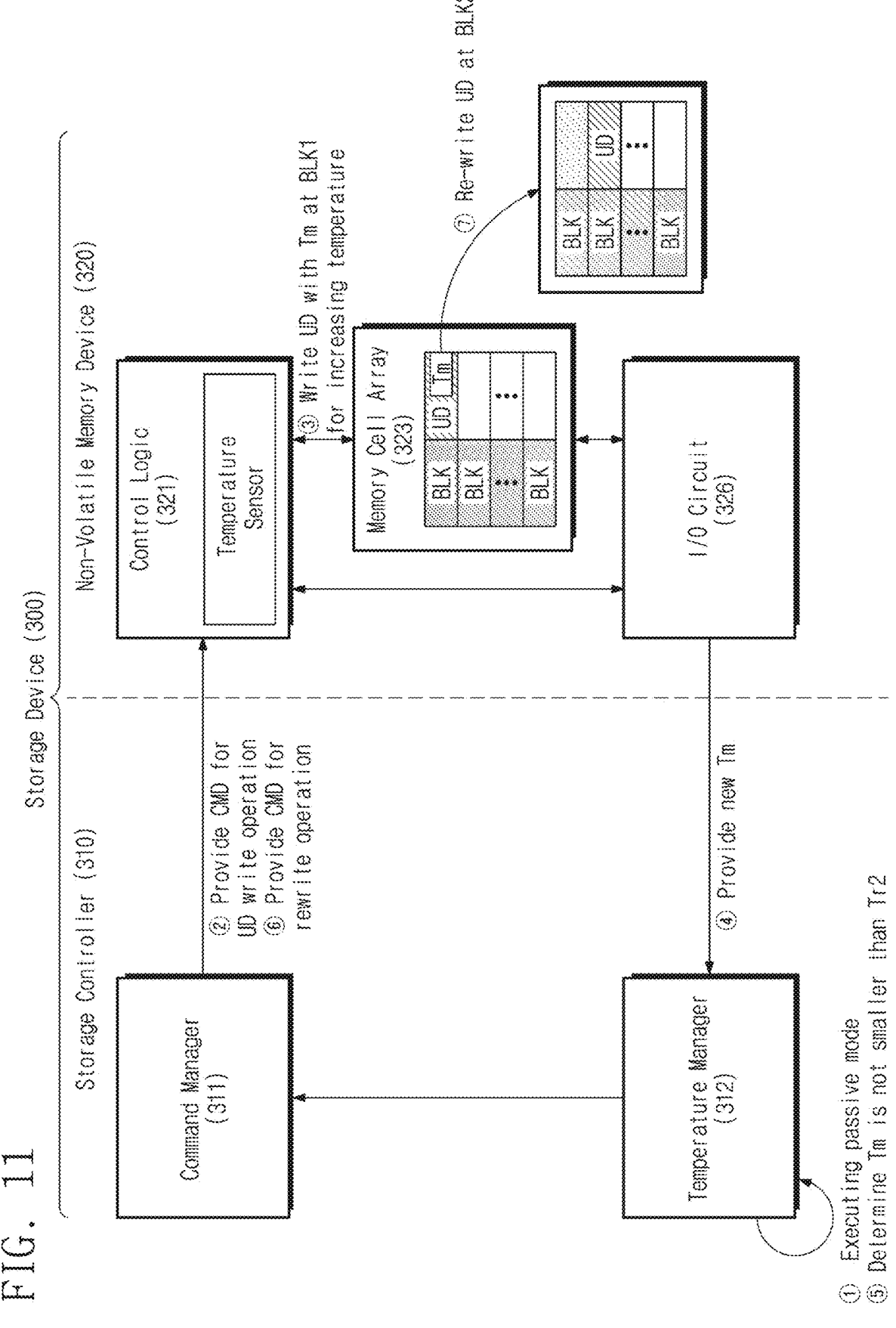
FIG. 11 is a diagram describing a rewrite operation of data which a storage device according to some example embodiments of the present disclosure writes in a passive mode.

FIG. 11 is a diagram describing a rewrite operation of data which a storage device according to some example embodiments of the present disclosure writes in a passive mode. The rewrite operation of data in which a storage device according to some example embodiments writes in the passive mode will be described with reference to FIG. 11. A storage device 300 may include a storage controller 310 and a non-volatile memory device 320.

The storage controller 310 may include a command manager 311 and a temperature manager 312. The non-volatile memory device 320 may include control logic 321, a memory cell array 323, and an I/O circuit 326. The storage device 300 corresponds to the storage device 200 of FIG. 8.

The command manager 311 may manage a rewrite command. The rewrite operation may indicate to re-write user data UD, which the non-volatile memory device 320 writes at a low temperature, in any other memory block at a normal temperature.

After the passive mode is executed, the temperature manager 312 may determine whether a new measurement temperature value Tm is lower than the second threshold value Tr2. The new measurement temperature value Tm may be a measurement temperature value which is obtained after the non-volatile memory device 320 performs at least one memory operation based on a command.

Based on determining that the new measurement temperature value Tm is not lower than the second threshold value Tr2, the temperature manager 312 may request the command manager 311 to generate the rewrite command.

Depending on the request of the temperature manager 312, the command manager 311 may generate the rewrite command which includes the new measurement temperature value Tm and indicates the rewrite operation.

The control logic 321 may communicate with the storage controller 310, the memory cell array 323, and the I/O circuit 326. The control logic 321 may perform the write operation and the rewrite operation with respect to the memory cell array 323 based on the write command.

For example, in the passive mode, the control logic 321 may write the user data UD in the first memory block BLK1 of the memory cell array 323, based on a command indicating the write operation of the user data UD. In this case, the control logic 321 may control the memory cell array 323 such that the measurement temperature value Tm is stored in the first memory block BLK1 together with the user data UD.

In some example embodiments, the first memory block BLK1 may store the measurement temperature value Tm in the form of a tag of the user data UD. The measurement temperature value Tm stored in the form of a tag may be referred to as a "temperature tag of the user data UD". The temperature tag may be read together by the read operation of the user data UD later.

The control logic 321 may perform the rewrite operation based on the rewrite command.

First, based on the rewrite command, the control logic 321 may perform the read operation on a temperature tag Tm and the user data UD stored in the memory cell array 323. The control logic 321 may adjust a read voltage level of the read operation based on the temperature tag Tm. For example, the control logic 321 may adjust the read voltage level based on a difference between the new measurement temperature value Tm and a temperature value of the temperature tag Tm.

The control logic 321 may store the user data UD of the read operation, which is performed by using the adjusted read voltage level, in a second memory block BLK2 different from the first memory block BLK1.

Below, an operating method of the storage device 300 according to some example embodiments of the present disclosure will be described in detail.

In a first operation ①, the temperature manager 312 may execute the passive mode. For example, the temperature manager 312 may execute the passive mode based to determining that the measurement temperature value Tm received from the non-volatile memory device 320 is lower than the second threshold value Tr2.

In a second operation ②, the command manager 311 may provide the non-volatile memory device 320 with a first command indicating the write operation of the user data UD. The command manager 311 may generate the first command based on a host request indicating the write operation of the user data UD. In this case, the first command may include the measurement temperature value Tm.

In a third operation ③, the non-volatile memory device 320 may store the user data UD together with the measurement temperature value Tm, based on a first command. For example, the non-volatile memory device 320 may store the user data UD and the measurement temperature value Tm in the first memory block BLK1.

In a fourth operation ④, the I/O circuit 326 may provide a new measurement temperature value Tm to the storage controller 310. The new measurement temperature value Tm may indicate a temperature value which is measured by the temperature sensor after the non-volatile memory device 320 performs the memory operation.

In a fifth operation ⑤, the temperature manager 312 may determine that the new measurement temperature value Tm is not lower than the second threshold value Tr2. Based on determining that the new measurement temperature value Tm is not lower than the second threshold value Tr2, the temperature manager 312 may request the command manager 311 to generate the second command indicating the rewrite operation. In this case, the second command may include the new measurement temperature value Tm.

In a sixth operation ⑥, the command manager 311 may provide the non-volatile memory device 320 with the second command indicating the rewrite operation.

In a seventh operation ⑦, the non-volatile memory device 320 may perform the rewrite operation based on the second command. For example, the non-volatile memory device 320 may first adjust a read voltage level based on the temperature value of the temperature tag Tm and the new measurement temperature value Tm. The non-volatile memory device 320 may read the user data UD based on the adjusted read voltage level. The non-volatile memory device 320 may store the read user data UD in the second memory block BLK2.

In some example embodiments, a non-volatile memory device may perform the rewrite operation with respect to a plurality of user data to which temperature tags are attached, based on the rewrite command. For example, the non-volatile memory device may re-write first user data, which are stored in the first memory block BLK1 and include a first temperature tag, in the second memory block BLK2. The non-volatile memory device may re-write second user data, which are stored in a third memory block BLK3 and include a second temperature tag, in a fourth memory block BLK4.

As described above, when a storage device performs the write operation of user data corresponding to a host request at a low temperature, that is, when the storage device performs the write operation in the passive mode, the storage device may re-write the written data in any other memory block in a normal state, and thus, a data read error due to a temperature change may be prevented.

Figure 12:
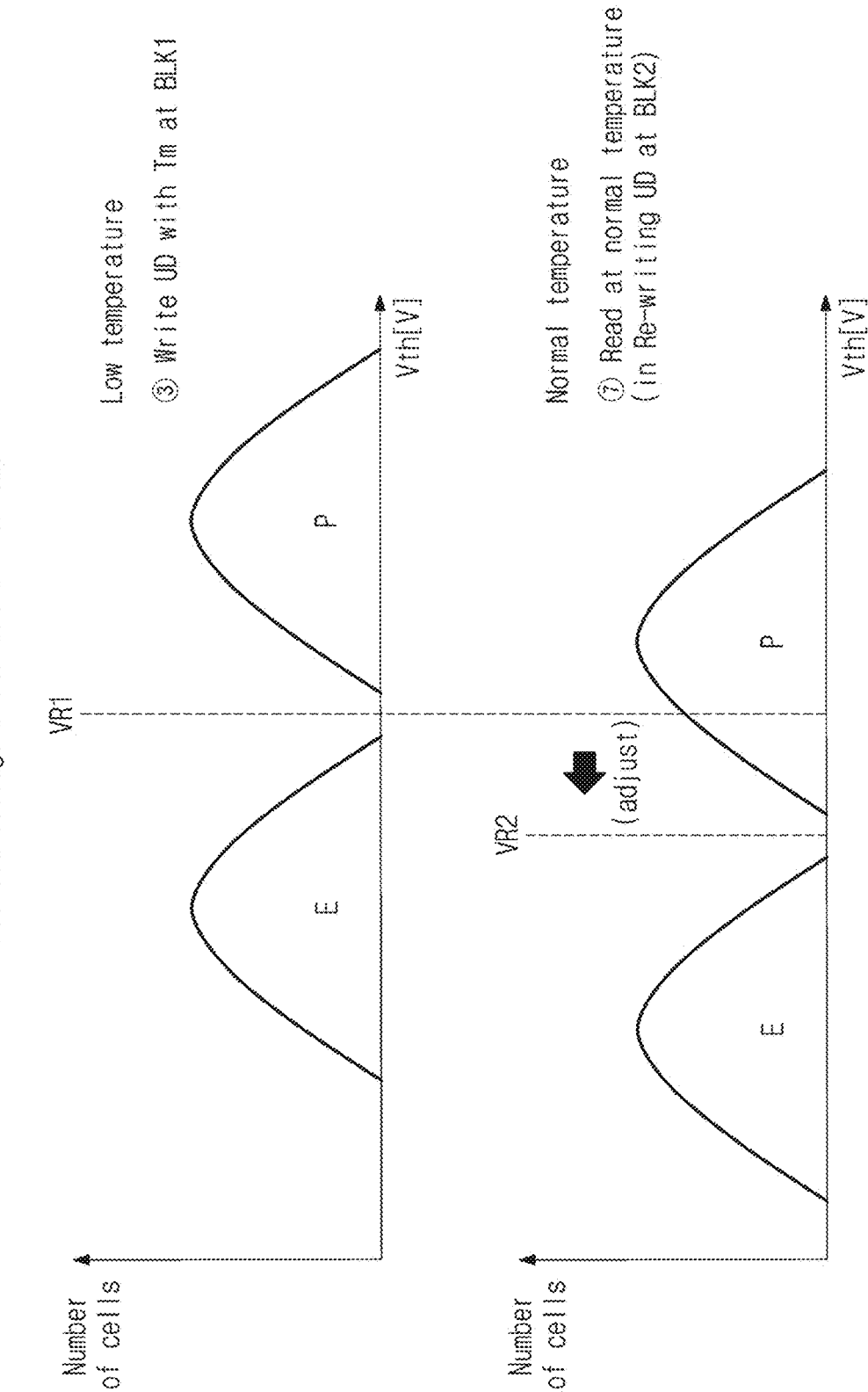
FIG. 12 is a diagram describing a change of a threshold voltage distribution according to some example embodiments of the present disclosure.

FIG. 12 is a diagram describing a change in a threshold voltage distribution according to some example embodiments of the present disclosure. A threshold voltage distribution in the third operation ③ of FIG. 11 and a threshold voltage distribution in the seventh operation ⑦ of FIG. 11 will be described with reference to FIG. 12. In FIG. 12, the horizontal axis represents a threshold voltage level, and the vertical axis represents the number of memory cells.

For convenience of description, a threshold voltage distribution of a memory cell being a single level cell of a storage device is described with reference to FIG. 12, but the present disclosure is not limited thereto.

In the third operation ③, the non-volatile memory device may perform the write operation of the user data UD by distinguishing the erase state "E" from the programming state "P" based on a first read voltage level VR1. The first read voltage level VR1 may be an optimal read voltage level capable of distinguishing the erase state "E" from the programming state "P".

In the read operation of the user data UD stored in the first memory block BLK1, a threshold voltage distribution in the seventh operation ⑦ may be in a state of being shifted toward a smaller threshold voltage level, compared to the threshold voltage distribution in the third operation ③. The non-volatile memory device may adjust a read voltage level based on a new measurement temperature value. For example, the non-volatile memory device may adjust the read voltage level to a second read voltage level VR2. The second read voltage level VR2 may be an optimal read voltage level capable of distinguishing the erase state "E" from the programming state "P" in the shifted threshold voltage distribution.

The non-volatile memory device may again store the data read from the first memory block BLK1 in a memory block different from the first memory block BLK1.

According to an example embodiment of the present disclosure, a storage device performing a dummy read operation and an operating method thereof are provided.

Also, when a temperature of a non-volatile memory device is low, without a separate host request and a data output, the storage device may control the non-volatile memory device such that a read operation is performed, and thus, the temperature of the non-volatile memory device may be efficiently increased.

While the present disclosure has been described with reference to example embodiments thereof, it will be apparent to those of ordinary skill in the art that various changes and modifications may be made thereto without departing from the spirit and scope of the present disclosure as set forth in the following claims.

Example embodiments have been described above with the aid of method steps illustrating the performance of specified functions and relationships thereof. The boundaries and sequence of these functional building blocks and method steps have been defined herein for convenience of description. Alternate boundaries and sequences can be defined, so long as the specified functions and relationships are appropriately performed. Any such alternate boundaries or sequences are thus within the scope and spirit of the claims.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

When either of the terms "about" or "substantially" are is used in this specification in connection with a numerical value, it is intended that the associated numerical value includes a manufacturing or operational tolerance (e.g., ±10%) above or below the stated numerical value. Moreover, regardless of whether numerical values or shapes are modified by the terms "about" or "substantially," it will be understood that these values and shapes should be construed as including a manufacturing and/or operational tolerance above or below the stated numerical value.

What is claimed is:

1. An operating method of a storage device which includes a storage controller and a non-volatile memory device, the method comprising:

provision, by the storage controller, the non-volatile memory device with a first command indicating a temperature read operation;

providing, by a temperature sensor of the non-volatile memory device, a first measurement temperature value to the storage controller based on the first command;

determining, by the storage controller, whether the first measurement temperature value is lower than a first threshold value;

providing, by the storage controller, the non-volatile memory device with a second command indicating a dummy read operation in response to determining that the first measurement temperature value is smaller than the first threshold value and an operation count to perform the dummy read operation; and performing, by the non-volatile memory device, the dummy read operation for heating based on the second command.

2. The method of claim 1, further comprising:

latching, by the non-volatile memory device, data of the dummy read operation in a page buffer and discarding the latched data.

3. The method of claim 1, further comprising:

providing, by the temperature sensor of the non-volatile memory device, a second measurement temperature value to the storage controller;

determining, by the storage controller, whether the second measurement temperature value is lower than the first threshold value;

providing, by the storage controller, the non-volatile memory device with a third command indicating a dummy read operation, based to determining that the second measurement temperature value is lower than the first threshold value; and performing, by the non-volatile memory device, the dummy read operation based on the third command.

4. The method of claim 1, further comprising:

generating, by the temperature sensor of the non-volatile memory device, a second measurement temperature value;

determining, by the non-volatile memory device, whether the second measurement temperature value is lower than the first threshold value; and again performing, by the non-volatile memory device, the dummy read operation in response to determining that the second measurement temperature value is lower than the first threshold value.

5. The method of claim 1, wherein the storage controller further includes a look-up-table (LUT), wherein the LUT includes a plurality of temperature ranges and a plurality of LUT operation counts respectively corresponding to the plurality of temperature ranges, and wherein the operation count is based on one of the plurality of LUT operation counts.

6. The method of claim 5, wherein the providing of the non-volatile memory device with the second command indicating the dummy read operation in response to determining that the first measurement temperature value is lower than the first threshold value by the storage controller includes:

determining, by the storage controller, a target operation count, which corresponds to a target temperature range including the first measurement temperature value, from among the plurality of temperature ranges with reference to the LUT; and providing, by the storage controller, the non-volatile memory device with the second command including the target operation count and indicating the dummy read operation, and wherein the performing the dummy read operation for heating based on the second command by the non-volatile memory device includes:

further performing, by the non-volatile memory device, the dummy read operation as much as a count smaller than the target operation count by one.

7. The method of claim 5, wherein a first operation count corresponding to a first temperature range among the plurality of temperature ranges is more than a second operation count corresponding to a second temperature range higher than the first temperature range from among the plurality of temperature ranges.

8. The method of claim 1, wherein the storage device is configured to communicate with a host, and wherein the determining whether the first measurement temperature value is lower than the first threshold value by the storage controller includes:

determining, by the storage controller, whether the first measurement temperature value is lower than a second threshold value greater than the first threshold value, in response to determining that the first measurement temperature value is not lower than the first threshold value;

providing, by the storage controller, the non-volatile memory device with a third command indicating a first memory operation corresponding to a first request received from the host, in response to determining that the first measurement temperature value is lower than the second threshold value; and performing, by the non-volatile memory device, the first memory operation for heating based on the third command.

9. The method of claim 8, wherein the performing of the memory operation for heating based on the third command by the non-volatile memory device further includes:

providing, by the temperature sensor of the non-volatile memory device, a second measurement temperature value to the storage controller;

determining, by the storage controller, whether the second measurement temperature value is lower than the second threshold value;

providing, by the storage controller, the non-volatile memory device with a fourth command indicating a second memory operation corresponding to a second request received from the host in response to determining that the second measurement temperature value is lower than the second threshold value; and performing, by the non-volatile memory device, the second memory operation for heating based on the fourth command.

10. The method of claim 8, wherein the first memory operation is a write operation of user data, wherein the third command includes the user data and the first measurement temperature value, and wherein the performing of the first memory operation for heating based on the third command by the non-volatile memory device includes:

storing, by the non-volatile memory device, the user data and the first measurement temperature value in a first memory block based on the third command.

11. The method of claim 10, wherein the first measurement temperature value is stored in the first memory block in the form of a tag of the user data.

12. The method of claim 10, wherein the performing of the first memory operation for heating based on the third command by the non-volatile memory device further includes:

providing, by the temperature sensor of the non-volatile memory device, a second measurement temperature value to the storage controller;

determining, by the storage controller, whether the second measurement temperature value is lower than the second threshold value;

providing, by the storage controller, the non-volatile memory device with a fourth command indicating a rewrite operation of the user data in response to determining that the second measurement temperature value is not lower than the second threshold value;

adjusting, by the non-volatile memory device, a read voltage level based on the first measurement temperature value and the second measurement temperature value in response to the fourth command;

reading, by the non-volatile memory device, the user data based on the adjusted read voltage level; and storing, by the non-volatile memory device, the read user data in a second memory block different from the first memory block.

13. The method of claim 10, wherein a temperature tolerance of the first memory block is greater than temperature tolerances of an at least one remaining memory block.

14. A storage device comprising:

a non-volatile memory device including a temperature sensor; and a storage controller, the storage controller configured to provide a temperature read command to the non-volatile memory device, to receive a measurement temperature value measured by the temperature sensor, and to compare the measurement temperature value with a first threshold value or a second threshold value, wherein the storage device communicates with a host, wherein the first threshold value is lower than the second threshold value, wherein the storage controller is further configured to:

execute an activate mode when the measurement temperature value is lower than the first threshold value, wherein the activate mode defines a dummy read operation for heating, and execute a passive mode when the measurement temperature value is greater than or equal to the first threshold value and is lower than the second threshold value, wherein the passive mode defines a memory operation corresponding to a request received from the host for heating.

15. The storage device of claim 14, wherein the storage controller is further configured to:

provide the non-volatile memory device with a first command indicating the dummy read operation, and wherein, based on the first command, the non-volatile memory device latches data of the dummy read operation and discards the latched data.

16. The storage device of claim 14, wherein the storage controller is further configured to:

provide the non-volatile memory device with a second command corresponding to the memory operation, and wherein the non-volatile memory device is further configured to:

perform the memory operation based on the second command.

17. An operating method of a storage controller which communicates with a non-volatile memory device, the method comprising:

providing the non-volatile memory device with a first command indicating a temperature read operation;

receiving a first measurement temperature value from the non-volatile memory device;

determining whether the first measurement temperature value is lower than a first threshold value;

providing the non-volatile memory device with a second command indicating a dummy read operation in response to determining that the first measurement temperature value is lower than the first threshold value and an operation count to perform the dummy read operation; and receiving a first response indicating that the dummy read operation is completed, from the non-volatile memory device.

18. The method of claim 17, wherein the first response includes a second measurement temperature value of the non-volatile memory device, which is measured after the dummy read operation is performed, wherein the method further comprises:

determining whether the second measurement temperature value is lower than the first threshold value; and providing the non-volatile memory device with a third command indicating a dummy read operation in response to determining that the second measurement temperature value is lower than the first threshold value, and wherein the second measurement temperature value is based on the second command.

19. The method of claim 17, wherein the storage controller communicates with a host, and wherein the determining whether the first measurement temperature value is lower than the first threshold value includes:

determining whether the first measurement temperature value is lower than a second threshold value higher than the first threshold value, in response to determining that the first measurement temperature value is not lower than the first threshold value;

providing the non-volatile memory device with a second command indicating a memory operation corresponding to a request received from the host, in response to determining that the first measurement temperature value is lower than the second threshold value; and receiving a second response indicating that the memory operation is completed, from the non-volatile memory device.

\* \* \* \* \*